United States Patent
Li et al.

[11] Patent Number: 6,148,906
[45] Date of Patent: Nov. 21, 2000

[54] FLAT PLATE HEAT PIPE COOLING SYSTEM FOR ELECTRONIC EQUIPMENT ENCLOSURE

[75] Inventors: Hsi-Shang Li; Chen-Ang Hsiao, both of Taipei, Taiwan

[73] Assignee: Scientech Corporation, Taipei, Taiwan

[21] Appl. No.: 09/061,016

[22] Filed: Apr. 15, 1998

[51] Int. Cl.[7] .................................................. F28D 15/00
[52] U.S. Cl. ................ 165/104.33; 165/104.26; 165/185; 361/687; 361/700; 361/704; 174/15.2; 257/715
[58] Field of Search ........................ 165/104.33, 104.19, 165/104.26, 185; 361/687–700; 174/15.2; 257/719, 727

[56] References Cited

U.S. PATENT DOCUMENTS

| | | | |
|---|---|---|---|
| 3,834,457 | 9/1974 | Madsen | 165/104.33 |
| 4,046,190 | 9/1977 | Marcus et al. | 165/104.33 |
| 5,283,715 | 2/1994 | Carlsten et al. | 165/104.33 |
| 5,465,782 | 11/1995 | Sun et al. | 165/104.26 |
| 5,579,830 | 12/1996 | Giammaruti | |
| 5,588,483 | 12/1996 | Ishida | 165/104.33 |
| 5,621,613 | 4/1997 | Haley et al. | 361/687 |
| 5,642,775 | 7/1997 | Akachi | |
| 5,646,822 | 7/1997 | Bhatia et al. | 165/104.33 |
| 5,694,295 | 12/1997 | Mochizuki et al. | 165/104.33 |
| 5,697,428 | 12/1997 | Akachi | |
| 5,725,050 | 3/1998 | Meyer, IV et al. | 165/104.33 |
| 5,781,409 | 7/1998 | Mecredy, III | 361/687 |
| 5,796,581 | 8/1998 | Mok | 361/687 |
| 5,822,187 | 10/1998 | Garner et al. | 361/687 |
| 5,832,987 | 11/1998 | Lowry et al. | 165/104.33 |
| 5,847,925 | 12/1998 | Progi et al. | 361/687 |
| 5,880,929 | 3/1999 | Bhatia | 165/104.33 |
| 5,910,883 | 6/1999 | Cipolla et al. | 361/687 |

FOREIGN PATENT DOCUMENTS

| | | | |
|---|---|---|---|
| 702287 | 3/1996 | European Pat. Off. | 165/104.33 |

*Primary Examiner*—Ira S. Lazarus
*Assistant Examiner*—Terrell McKinnon
*Attorney, Agent, or Firm*—Daniel J. Bedell; Smith-Hill and Bedell

[57] ABSTRACT

A cooling system for an electronic equipment enclosure employs a flat plate heat pipe to deliver heat from the interior of the enclosure through a connector to a removable external heat sink. The heat pipe includes a metallic bottom plate having a depression therein containing a set of rods evenly spaced from one another. A top plate covers the bottom plate with the rods compressed therebetween. Channels formed between adjacent rods are partially evacuated and injected with an evaporative fluid. The fluid and its vapor circulate in the channels to convey heat from a warm end of the heat pipe to a cool end. The heat sink is of similar construction.

10 Claims, 4 Drawing Sheets

FLAT PLATE HEAT PIPE COOLING SYSTEM FOR ELECTRONIC EQUIPMENT ENCLOSURE

BACKGROUND OF THE INVENTION

1. Field of the Invention

The present invention relates in general to systems for cooling electronic components mounted in an enclosure and in particular to a cooling system employing a heat pipe to conduct heat to a heat sink outside the enclosure.

2. Description of Related Art

When electronic components are installed in an enclosure, it is often necessary to remove the heat those components generate from the enclosure so that the components remain sufficiently cool to operate properly. The most common way to remove heat from an electronic component is through a metallic heat sink attached to the component. Heat travels by conduction from the component to the heat sink's fins which then radiate the heat into the surrounding air within the enclosure. A fan installed on an enclosure wall forces hot air away from the heat sink fins and out of the enclosure. However when a large number of electronic components are densely packed into a small enclosure, as for example the chassis of a notebook or laptop computer, it is difficult to provide enough space between the components for heat sinks without obstructing pathways for cooling air flow.

One way to remove heat from an enclosure without relying on cooling air is use a heat pipe. U.S. Pat. No. 5,579,830, issued Nov. 28, 1995 to Giammaruti, discloses the use of a large tubular heat pipe passing through the wall of an equipment enclosure. One end of the heat pipe extends into the enclosure and absorbs heat generated therein. The heat pipe conducts that heat to an opposite end extending outside of the enclosure. The external end of the heat pipe acts as a heat sink radiating the heat into the surrounding air. While this system does not require heat sinks or cooling air flow within the enclosure, it may be difficult to find clearance for a large, tubular heat pipe within a tightly packed enclosure. Also a large heat sink extending out of the enclosure is vulnerable to damage, particularly if that enclosure is the chassis of a portable notebook or laptop computer.

U.S. Pat. No. 5,642,775, issued Feb. 16, 1996 to Akachi, discloses a thin flat plate heat pipe formed from a thin plate having a set of small channels ("capillary tunnels") therein partially filled with fluid. When one end of the plate is heated, the fluid in each channel at the warm end of the heat pipe evaporates. The fluid vapor migrates to the cool end of each the channel where it condenses and flows back toward the warm end of the channel. The circulating vapor and fluid in each channel conveys heat from the warm end of the channel to the cool end. Akachi's flat plate heat pipe could fit into tight spaces in an equipment enclosure, for example between printed circuit cards installed in a motherboard. However Akachi does not indicate how such a heat pipe could be adapted for removing heat from an equipment enclosure. Akachi teaches using an extrusion method for producing a heat pipe plate with capillary channels formed therein. However it may be difficult to provide a plate with a large number of small tightly packed capillary channels by extrusion.

U.S. Pat. No. 5,697,428 issued Dec. 16, 1997 to Akachi discloses forming channels in a flat plate heat pipe, apparently by cutting them into the plate. However such a method is slow and expensive. Also, channel walls formed by cutting can be rough and less conducive to fluid flow than channel walls formed by extrusion.

What is needed is an efficient, inexpensive, easy to manufacture and install cooling system for removing heat from a tightly packed enclosure that does not rely on cooling air flow within the enclosure, does not require substantial space within the enclosure, and does not require bulky or unwieldy structures outside the enclosure.

SUMMARY OF THE INVENTION

In accordance with one aspect of the present invention, a system for cooling the interior of an electronic component enclosure includes a thin flat-plate heat pipe having one end held by a connector mounted in a wall of the enclosure and another end extending into the enclosure interior. A card-like heat sink positioned outside the enclosure has an end inserted into the connector where it makes thermal contact with the heat pipe. When the heat pipe absorbs heat generated within the enclosure it conveys that heat to the heat sink. The heat sink then conducts the heat away from the enclosure and radiates it into the air surrounding the enclosure. When the heat sink is not in use, as for example, when the enclosure is the case of a notebook or laptop computer being transported, the heat sink may be removed from the connector.

In accordance with another aspect of the invention, the heat pipe is formed by a set of thin metallic rods sandwiched in parallel within a space between two thin, metallic plates. The rods are spaced apart to form a set of air-tight channels with each channel bounded on either side by two adjacent rods and on top, bottom and ends by the metallic plates. The channels extend nearly the full length of the heat pipe. The channels are evacuated to a low pressure then injected with a small amount of evaporative fluid. When the fluid is cool, capillary forces draw the fluid within each channel into small areas near the points of contact between the rods and the metallic plate, thereby forming four lines of fluid, each extending the length of the channel. When one end of the heat pipe is heated, ends of the fluid lines at the warm ends of the channels evaporate. The resulting vapor moves through the channels toward the cool ends of the heat pipe where it condenses back into fluid. Capillary forces then pull the condensed fluid into the cool ends of the fluid lines and the excess fluid at the cool ends of the fluid lines causes the fluid lines to flow toward the heated end of the channel. The continuous fluid/vapor circulation moves heat quickly from the warm end of the channel to the cool end. The heat pipe is inexpensive to manufacture and with the rods closely spaced, the heat pipe can provide a large number of heat-conducting channels in a relatively thin structure and is therefore highly efficient at moving heat.

In accordance with yet another aspect of the invention, the heat sink is similar in construction to the heat pipe.

In accordance with a further aspect of the invention, the heat pipe may be brought into contact with one or more heat-generating electronic components within the enclosure to move heat rapidly from these components to the outside air.

In accordance with a still further aspect of the invention, in an alternative embodiment thereof, the heat pipe is installed within the case of a notebook or laptop computer of the type having a cover attached via a hinge to the case, wherein a video display mounted a front surface of the cover may be viewed when the cover is open. An end of a flat-plate heat sink, either mounted on, mating with, or forming an integral part of the back of the cover, thermally contacts the heat pipe when the cover is open. The heat sink therefore conducts heat away from the heat pipe and disperses it into the surrounding air.

It is accordingly an object of the invention to provide a means for removing heat from a tightly packed electronic equipment enclosure that does not rely on large amounts of internal cooling air flow, and which does not require bulky heat sinks permanently attached to the outside of the enclosure.

The remaining portions of this specification particularly point out and distinctly claims the subject matter of the present invention. However those skilled in the art will best understand both the organization and method of operation of the invention, together with further advantages and objects thereof, by reading the remaining portions of the specification in view of the accompanying drawings wherein like reference characters refer to like elements.

BRIEF DESCRIPTION OF THE DRAWING(S)

FIG. 1 illustrates in exploded cut-away perspective view a cooling apparatus for removing heat from an enclosure containing heat-generating electronic components, FIG. 2 illustrates the heat pipe of FIG. 1 in cut-away perspective view, FIGS. 3 and 4 illustrate alternative versions of the heat pipe of FIG. 2 in enlarged sectional view, FIG. 5 illustrates the heat sink of FIG. 1 in cut-away perspective view, FIG. 6 illustrates the connector of FIG. 1 in perspective view, FIG. 7 illustrates the connector of FIG. 6 in sectional view, and FIGS. 8 and 9 are sectional views of a conventional notebook computer cooled by embodiments of the cooling system of the present invention.

DESCRIPTION OF THE PREFERRED EMBODIMENT(S)

Figure 1:
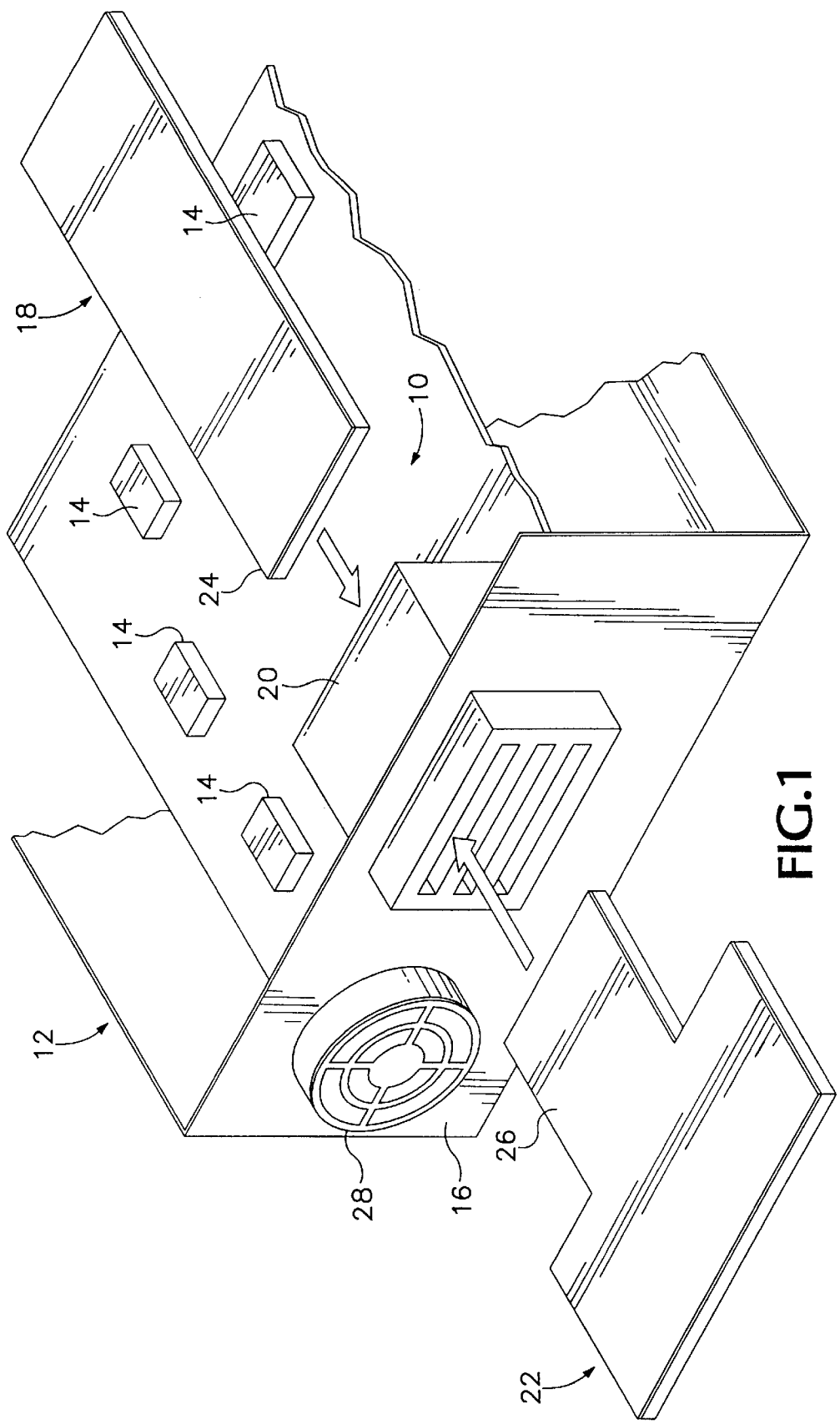

FIG. 1 illustrates in exploded cut-away perspective view a cooling apparatus 10 for removing heat from an enclosure 12 containing heat-generating electronic components 14. Cooling apparatus 10 includes a thin flat-plate heat pipe 18, a connector 20 mounted in, and extending through, a wall 16 of enclosure 12 and a removable card-like heat sink 22. Heat pipe 18 resides within enclosure 12 with one end 24 inserted into connector 20. Heat sink 22 resides outside of enclosure 12 and also has an end 26 inserted into connector 20. Ends 24 and 26 of heat pipe 18 and heat sink 22 thermally contact each other within connector 20.

Heat pipe 18 absorbs heat from the ambient air within enclosure 12 and directly from any component 14 that it may contact. The absorbed heat travels though heat pipe 18 to its end 24 within connector 20 where it passes into end 26 of heat sink 22. As the heat travels outward through heat sink 22 from end 26, heat sink 22 radiates that heat through its surfaces into the surrounding air. A fan 28 optionally mounted on the outside of enclosure 12 near connector 20, may blow cooling air across heat sink 22 to increase the rate at which heat sink 22 radiates heat.

Heat pipe 18 is thin and flat and can easily be adapted and positioned to fit into narrow spaces within an enclosure 12, as for example between adjacent circuit cards installed in a motherboard. Heat pipe 18 can also be positioned so that it passes near or even contacts one or more heat-producing electronic components 14 thereby to increase the efficiency with which system 10 removes heat from those components. Heat sink 22 is shaped like a thin card with a narrow end 26 that can be easily inserted into a slot in connector 20. Heat sink 22 can also be easily removed from connector 20 when not needed or to protect it when enclosure 12 is being transported. Although only a single heat pipe 18 and a single heat sink 22 are shown in FIG. 1, additional heat pipes and heat sinks can be inserted into connector 20 when necessary to increase the rate of heat transfer from enclosure 12.

Heat Pipe Construction

Figure 2:
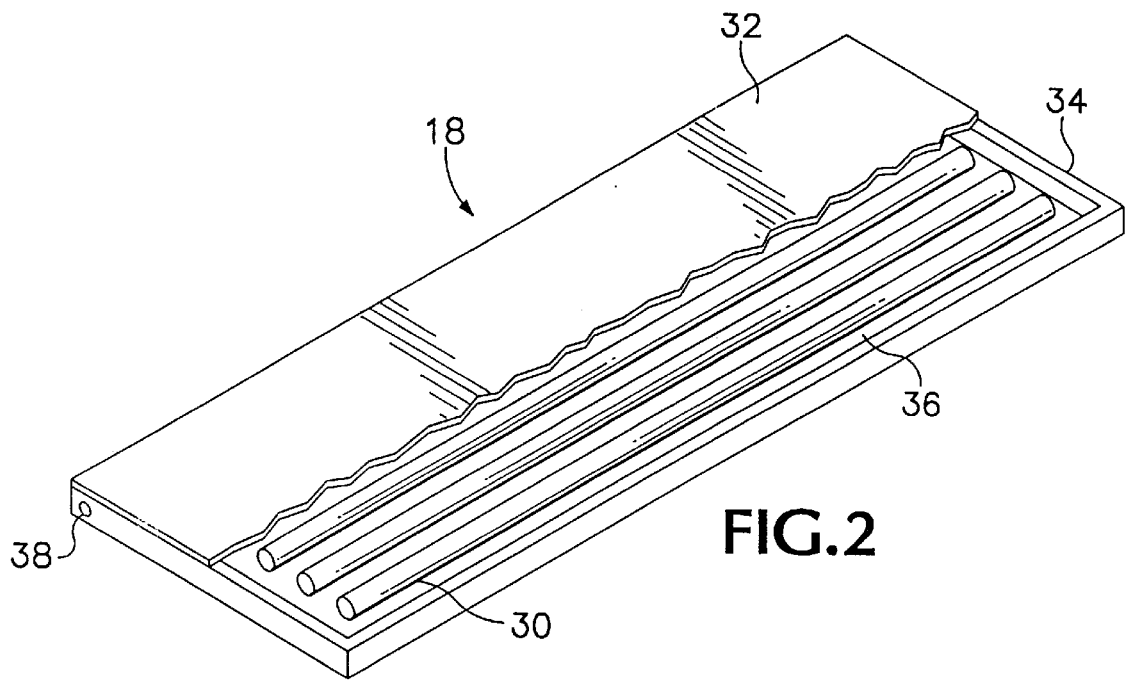
Figure 3:
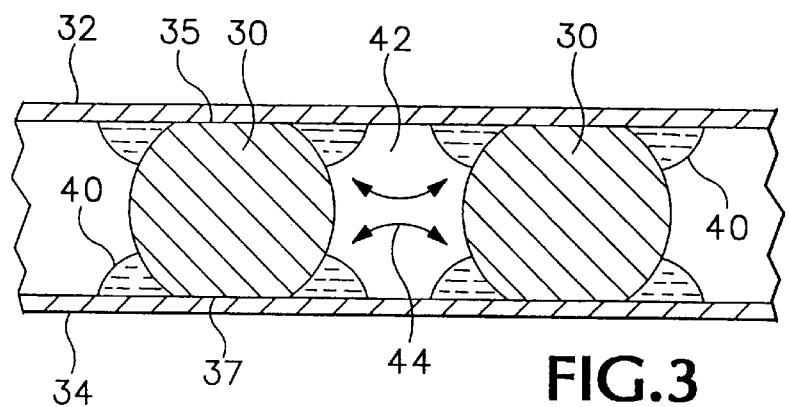

FIG. 2 illustrates heat pipe 18 of FIG. 1 in cut-away perspective view. FIG. 3 is an enlarged partial sectional view of the heat pipe of FIG. 2. Referring to FIGS. 2 and 3, heat pipe 18 includes 19 metallic rods 30, each 0.5 mm in diameter and 88 mm long, sandwiched in parallel between polished surfaces of two thin, rectangular, metallic plates 32 and 34. Rods 30, suitably metallic wires formed by extrusion, have smooth surfaces. Upper plate 32 and lower plate 34 are both 100 mm long and 50 mm wide. Upper plate 32 is 0.3 mm thick. Lower plate 34 is 0.7 mm thick but has a depression 36 of uniform 0.4 mm depth for receiving rods 30. Depression 36 is 90 mm long and 40 mm wide, and rods 30 are evenly spaced apart therein. The upper and lower plates 32 and 34 are press bonded together and sealed so that the space between upper and lower plates 32 and 34 defined by depression 36 is airtight. Since rods 30 are 0.5 mm in diameter while depression 36 is only 0.4 mm deep, the upper and lower surfaces (35, 37) of rods 30 deform somewhat as plates 32 an 34 are pressed bonded together and tightly contact both top and bottom plates 32 and 34 throughout its entire length.

The airtight depression 36 is then evacuated to a low pressure via a small hole 38 in lower plate 34 and a small amount of fluid 40 is injected into depression 36 through hole 38. Hole 38 is then sealed. As best seen in FIG. 3, a channel 42 is formed by the space bounded in either side by each adjacent pair of rods 30 and on top and bottom by plates 32 and 34. As fluid 40 disperses into each channel 42, capillary forces draw fluid 40 into areas nearest the points of contact 35, 37 between rods 30 and plates 32 and 34 thereby forming continuous four fluid lines 44 each extending the length of each channel 42.

When one end of heat pipe 18 is heated, fluid 40 at that end of the heat pipe evaporates. The resulting vapor disperses though channels 42 toward the cooler end of heat pipe 18. As vapor in each channel 42 contacts the cool ends of upper and lower plates 32 and 34, heat is transferred from the vapor to plates 32 and 34. As the vapor then condenses into fluid, capillary forces propel the condensed fluid into the cool ends of the fluid lines 44 within channels 42. As the fluid condenses it rejoins the cool ends of the fluid lines 44 and capillary forces cause fluid lines 44 to flow toward the heated ends of channels 42 to replace the evaporated fluid. The continuous fluid/vapor circulation within each channel 42 moves heat quickly from the warm end of heat pipe 18 to its cool end.

Those skilled in the art will appreciate that heat pipe 18 need not be flat and rectangular as illustrated in FIG. 2. As long as each channel 42 provides continuous paths for fluid lines 44 throughout the length of heat pipe 18, the heat pipe may be bent, twisted or varied in width as necessary to allow it to fit within an available space within enclosure 12.

Figure 4:
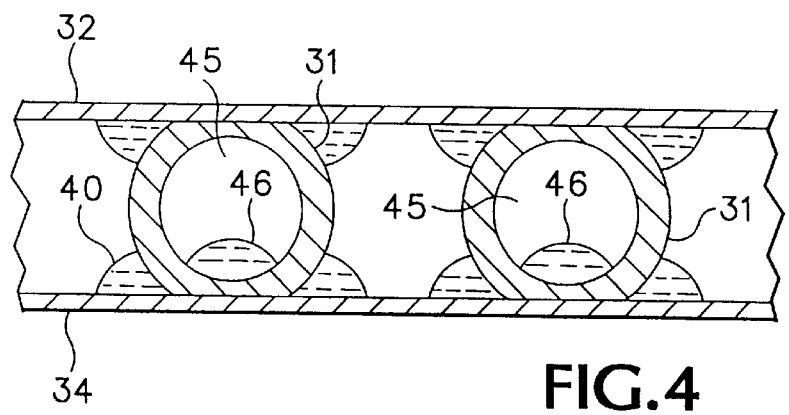

FIG. 4 illustrates a version of the heat pipe that is generally similar to the version illustrated in FIG. 3. However whereas rods 30 shown in FIG. 3 have solid metallic interiors, rods 31 shown in FIG. 4 are hollow tubes. The hollow centers of the tubes provide additional channels 45 for fluid 46, thereby increasing the heat transfer efficiency of heat pipe 18.

Heat Sink Construction

Figure 5:
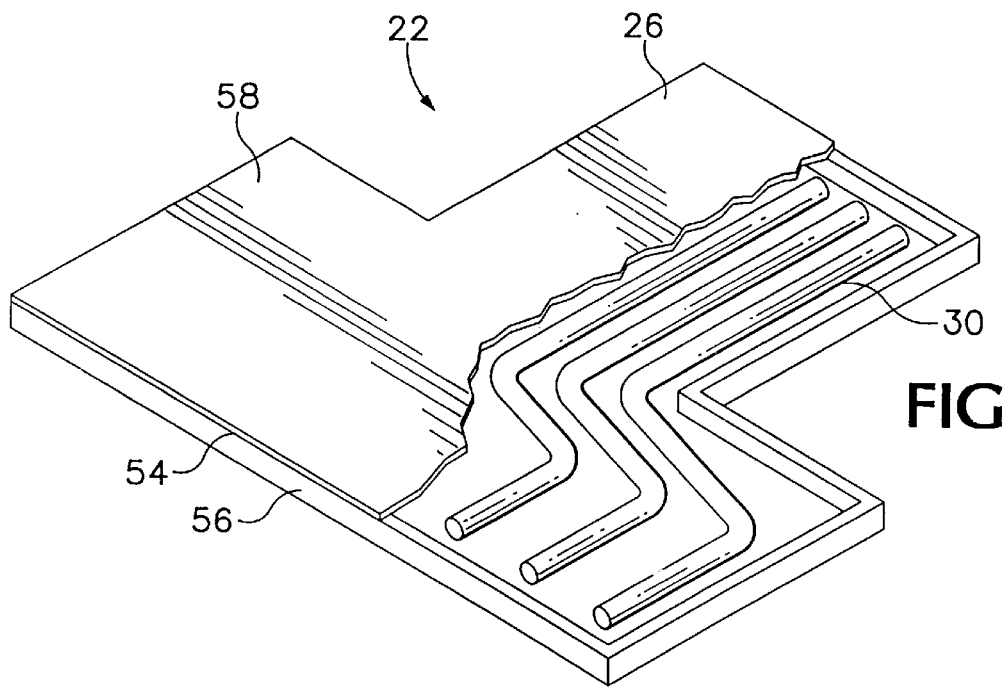

FIG. 5 illustrates heat sink 22 in more detailed cut-away perspective view. Heat sink 22 is generally similar in construction and operation to heat pipe 18. However the upper and lower plates 54 and 56 of heat sink 22 are T-shaped, being relatively wide at its distal end 58 so that it can radiate heat efficiently, while relatively narrow at proximal end 26 so that it can mate with connector 20 of FIG. 1. Accordingly the rods 30 sandwiched between upper and lower plates 54 and 56 are closely spaced at its narrow proximal end 26 but are more widely spaced at its wide distal end 58. Heat sink 22 is preferably black oxidized to increase its emissivity.

Connector Construction

Figure 6:
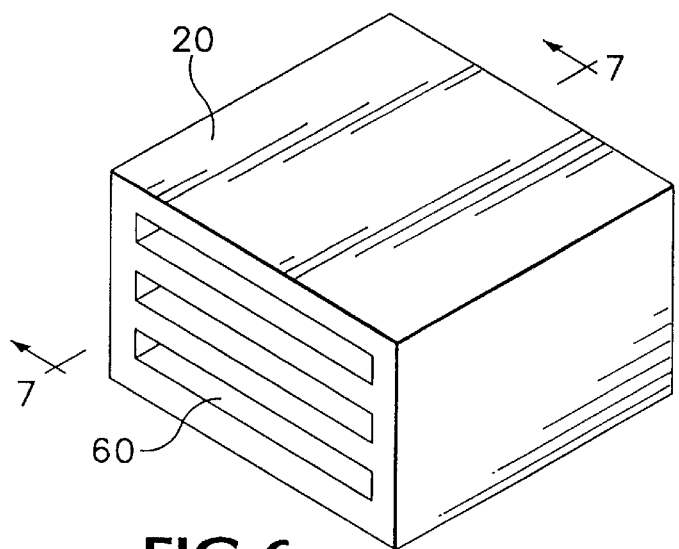
Figure 7:
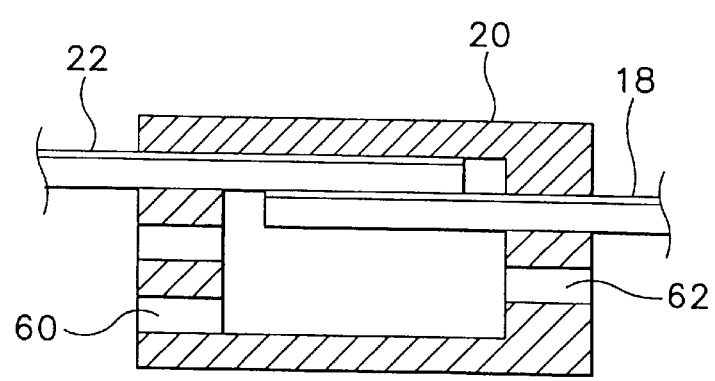

FIGS. 6 and 7 illustrate connector 20 of FIG. 1 in perspective and sectional view. Connector 20, suitably constructed of a solid metallic block, contains machined rectangular slots 60 and 62 sized to receive up to two heat pipes 18 and three heat sinks 22. Slots 60 and 62 are vertically offset from one another so that when heat pipes 18 and heat sinks 22 are inserted therein, they overlap and contact one another as shown in FIG. 7. The thermally conductive body of connector 20 also provides a path for heat passing between heat pipe 18 and heat sink 22. Slots 60 and 62 hold and secure each heat pipe 18 and heat sink 22 but allow them to be easily pulled out of the slots. Thus heat sink 22 may be quickly and easily removed, as for example when enclosure 12 is the case of a notebook or laptop computer to be transported.

Notebook or Laptop Computer Cooling System

Figure 8:
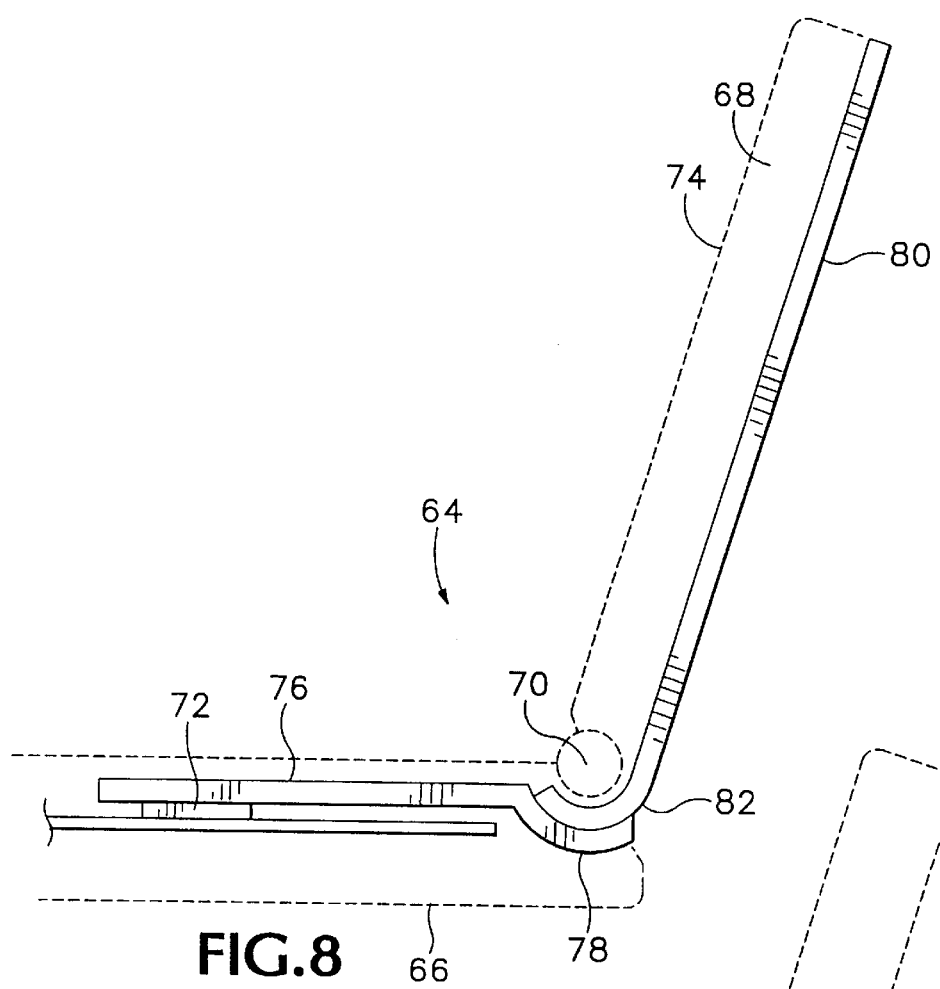

FIG. 8 illustrates an alternative embodiment of the cooling system of the present invention adapted for use in a conventional notebook or laptop computer 64 having a case 66 and a cover 68 rotatively attached to case 66 via a hinge 70. Case 66 holds heat-producing electronics components including, for example, a central processing unit (CPU) 72. An inside surface 74 of cover 68 includes a display screen that may be viewed when cover 68 is open. In accordance with the invention, a flat-plate heat pipe 76 extending into the interior of case 66 includes a curved end section 78 extending out of case 66 near hinge 70. To improve cooling efficiency, heat pipe 76 may be positioned to contact CPU 72 or other heat-producing components within case 66. A heat sink 80 forming (or attached to) a back surface of cover 68 also includes a curved end 82 wrapping partially around hinge 70 so that it contacts the curved end 78 of heat pipe 76 when cover 68 is open. Except for differences in shape, heat pipe 76 and heat sink 80 are generally similar in nature to heat pipe 18 and heat sink 22 of FIG. 1. Heat pipe 76 conducts heat generated inside case 66 to its curved end 78. The heat then moves into the curved end 82 of heat sink 80 and travels outward through heat sink 80 from end 82. Heat sink 80 then dissipates the heat into the surrounding air.

Figure 9:
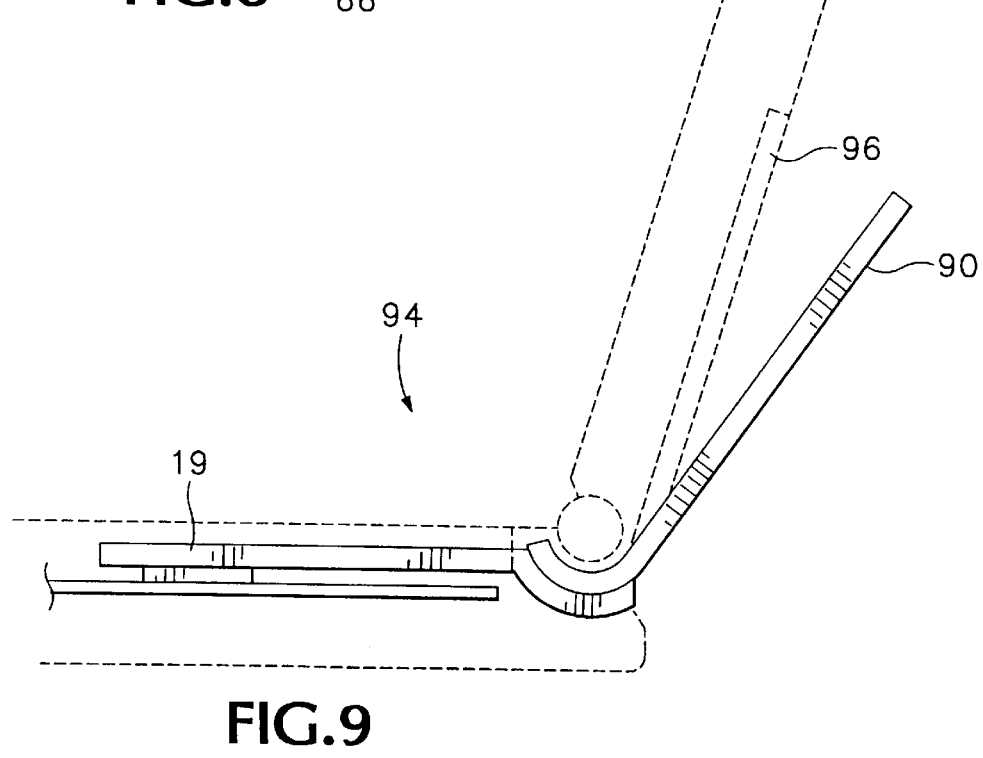

FIG. 9 depicts a notebook or laptop computer cooling system generally similar to the cooling system illustrated in FIG. 8. However in FIG. 9, the heat sink 90 is not attached to or a part of cover 92 of a notebook or laptop computer 94 but is rather separate therefrom and may be rotated away from cover 92 to provide more efficient heat radiation when computer 94 is in use. When computer 94 is not in use, heat sink 90 may be rotated into a recess 96 within cover 92.

While the forgoing specification has described preferred embodiment(s) of the present invention, one skilled in the art may make many modifications to the preferred embodiment without departing from the invention in its broader aspects. For example the stated dimensions of the components of heat pipe 18 of FIG. 2 can vary depending on the heat transfer and space requirements of particular applications. Rods 30 and plates 32 and 34 can be constructed of various type of thermal conductors including, for example, copper and aluminum or alloys thereof. Those skilled in the art will recognize that many types of evaporative fluids 40 could be used in channels 42 such as for example, water, acetone or ethanol. The appended claims therefore are intended to cover all such modifications as fall within the true scope and spirit of the invention.

What is claimed is:

1. A flat plate heat pipe comprising:
    a bottom plate having an upper surface with a depression of substantially uniform depth therein, the depression being elongate in a first direction parallel to said upper surface;
    a plurality of rods spaced apart in parallel within said depression, each rod being elongate in said first direction;
    a top plate bonded to said upper surface of said bottom plate and covering said depression such that said depression is airtight, such that said rods are compressed between said bottom plate and said top plate with each of said rods contacting said bottom plate and with each of said rods contacting said top plate, thereby forming a plurality of channels within said depression, each channel being bounded by the bottom plate, the top plate, and an adjacent pair of said plurality of rods, each channel being elongate in said first direction; and
    an evaporative fluid partially filling each of said elongate channels.

2. The flat plate heat pipe in accordance with claim 1 wherein said rods have solid centers.

3. The flat plate heat pipe in accordance with claim 1 wherein said top and bottom plates are metallic.

4. The flat plate heat pipe in accordance with claim 3 wherein said rods are metallic.

5. A flat plate heat pipe comprising:
    a bottom plate having an upper surface with a depression of substantially uniform depth therein;
    a plurality of rods spaced apart in parallel within said depression, wherein said rods have hollow centers;
    a top plate bonded to said upper surface of said bottom plate and covering said depression such that said depression is airtight, such that each of said rods is compressed between said bottom plate and said top plate; and
    an evaporative fluid partially filling said depression between said rods and partially filling said hollow centers of said rods.

6. A cooling system for a computer of the type having an enclosure having an interior containing heat-generating electronic components and having a cover rotatively attached by a hinge to the enclosure, the cover having a front side and a back side, the front side containing a video display viewable when the cover is rotated to an open position, the cooling system comprising:
    a heat pipe having a first end extending into the interior of the enclosure and having a second end extending out of the enclosure,
    a heat sink external to said enclosure, and
    means for delivering heat from said heat pipe to said heat sink,
    wherein said heat pipe comprises:
        a bottom plate having an upper surface with a depression of substantially uniform depth therein, the depression being elongate in a first direction parallel to said upper surface;

a plurality of rods spaced apart in parallel within said depression, each rod being elongate in said first direction;

a top plate bonded to said upper surface of said bottom plate and covering said depression such that said depression is airtight, with each of said rods contacting said bottom plate and with each of said rods contacting said top plate, thereby forming a plurality of channels within said depression, each channel being bounded by the bottom plate, the top plate, and an adjacent pair of said plurality of rods, each channel being elongate in said first direction; and first evaporative fluid partially filling each of said elongate channels.

7. The cooling system in accordance with claim 6 wherein said cover includes a recess, wherein said heat sink resides in said recess when said cover is closed and wherein said heat sink extends away from said recess when said cover is open.

8. A cooling system for a computer of the type having an enclosure having an interior containing heat-generating electronic components and having a cover rotatively attached by a hinge to the enclosure, the cover having a front side and a back side, the front side containing a video display viewable when the cover is rotated to an open position, the cooling system comprising:

a heat pipe having a first end extending into the interior of the enclosure and having a second end extending out of the enclosure, a heat sink external to said enclosure, and means for delivering heat from said heat pipe to said heat sink wherein said heat sink and said heat pipe each comprise;

a metallic bottom plate having an upper surface with a uniform depth depression therein, the depression being elongate in a first direction parallel to said upper surface;

a plurality of rods spaced apart within said depression, each rod being elongate in said first direction;

a metallic top plate bonded to said upper surface of said bottom plate and covering said depression such that said depression is airtight, said top plate having a lower surface contacting said rods such that said rods are compressed between said bottom plate and said top plate with each of said rods contacting said top plate and with each if said rods contacting said bottom plate, thereby forming a plurality of channels within said depression, each channel being bounded by the bottom plate, the top plate, and an adjacent pair of said plurality of rods, each channel being elongate in said first direction; and an evaporative fluid partially filling each of said elongate channels.

9. The cooling system in accordance with claim 6 wherein said heat pipe contacts at least one of said heat-generating components.

10. The cooling system in accordance with claim 6 wherein said heat sink is attached to said cover.

* * * * *